(12) United States Patent
Nonaka et al.

(10) Patent No.: US 7,544,552 B2
(45) Date of Patent: Jun. 9, 2009

(54) METHOD FOR MANUFACTURING JUNCTION SEMICONDUCTOR DEVICE

(75) Inventors: Ken-ichi Nonaka, Wako (JP); Hideki Hashimoto, Wako (JP); Seiichi Yokoyama, Wako (JP); Kensuke Iwanaga, Wako (JP); Yoshimitsu Saito, Wako (JP); Hiroaki Iwakuro, Hanno (JP); Masaaki Shimizu, Hanno (JP); Yusuke Fukuda, Hanno (JP); Koichi Nishikawa, Hanno (JP); Yusuke Maeyama, Hanno (JP)

(73) Assignees: Honda Motor Co., Ltd., Tokyo (JP); Shindengen Electric Manufacturing Co., Ltd., Tokyo (JP)

( * ) Notice: Subject to any disclaimer, the term of this patent is extended or adjusted under 35 U.S.C. 154(b) by 148 days.

(21) Appl. No.: 11/386,661

(22) Filed: Mar. 23, 2006

(65) Prior Publication Data

US 2006/0216879 A1 Sep. 28, 2006

(30) Foreign Application Priority Data

Mar. 23, 2005 (JP) ............................ P2005-084671

(51) Int. Cl.
*H01L 21/337* (2006.01)
*H01L 29/772* (2006.01)
*H01L 21/339* (2006.01)
*H01L 21/338* (2006.01)
*H01L 29/768* (2006.01)
*H01L 29/78* (2006.01)

(52) U.S. Cl. ...................... 438/186; 438/146; 438/175; 438/188; 257/213; 257/288; 257/347; 257/352; 257/E29.233; 257/E29.27; 257/E29.243

(58) Field of Classification Search ................ 257/216, 257/219, E29.233, E29.27, E29.243, E21.537–E21.539, 257/213, 288, 347, 352; 438/146, 175, 186, 438/188

See application file for complete search history.

(56) References Cited

U.S. PATENT DOCUMENTS

| 4,738,935 | A | * | 4/1988 | Shimbo et al. | ............. | 438/455 |
| 5,541,426 | A | * | 7/1996 | Abe et al. | .................. | 257/170 |
| 5,554,561 | A | | 9/1996 | Plumton et al. | | |
| 5,705,830 | A | * | 1/1998 | Siergiej et al. | ................. | 257/77 |
| 6,917,054 | B2 | * | 7/2005 | Onose et al. | .................. | 257/77 |
| 7,449,734 | B2 | * | 11/2008 | Nonaka et al. | ............. | 257/288 |
| 2004/0135178 | A1 | | 7/2004 | Onose et al. | | |

OTHER PUBLICATIONS

2002 Report on the Results of Research, New Energy and Industrial Technology Development Organization, Development of Ultra Low Loss Power Devices Technology, and Device Design Technology, Research and Development Association for Future Electron Devices.

(Continued)

*Primary Examiner*—Alexander G Ghyka
*Assistant Examiner*—Leonard Chang
(74) *Attorney, Agent, or Firm*—Birch, Stewart, Kolasch & Birch, LLP

(57) ABSTRACT

A method for manufacturing a junction semiconductor device, having a step for forming a first high-resistance layer, a step for forming a channel-doped layer, a step for forming a second high-resistance layer, a step for forming a low-resistance layer of a first conductive type that acts as a source region, a step for performing partial etching to a midway depth of the second high-resistance layer and the low-resistance layer, a step for forming a gate region below the portion etched in the etching step, and a step for forming a protective film on the surface of the region between the gate region and the source region. A gate region is formed using relatively low energy ion implantation in the surface that has been etched in advance to a height that is between the lower surface of the source area and the upper surface of the channel-doped layer.

21 Claims, 11 Drawing Sheets

OTHER PUBLICATIONS

J. H. Zhao et al., 6A, 1kV 4H-SIC Normally-off Trenched-and-Implanted Vertical JFETs, Materials Science Forum, 2004, 1213-1216, 457-460, Trans Tech Publications, Switzerland.

Takahashi Shinohe et al., 600V5A 4H-SiC with Low $R_{on}S$ of $13m\Omega cm^2$, Proceedings of the Symposium on Static Induction Devices, 2002, 41-45, 17.

* cited by examiner

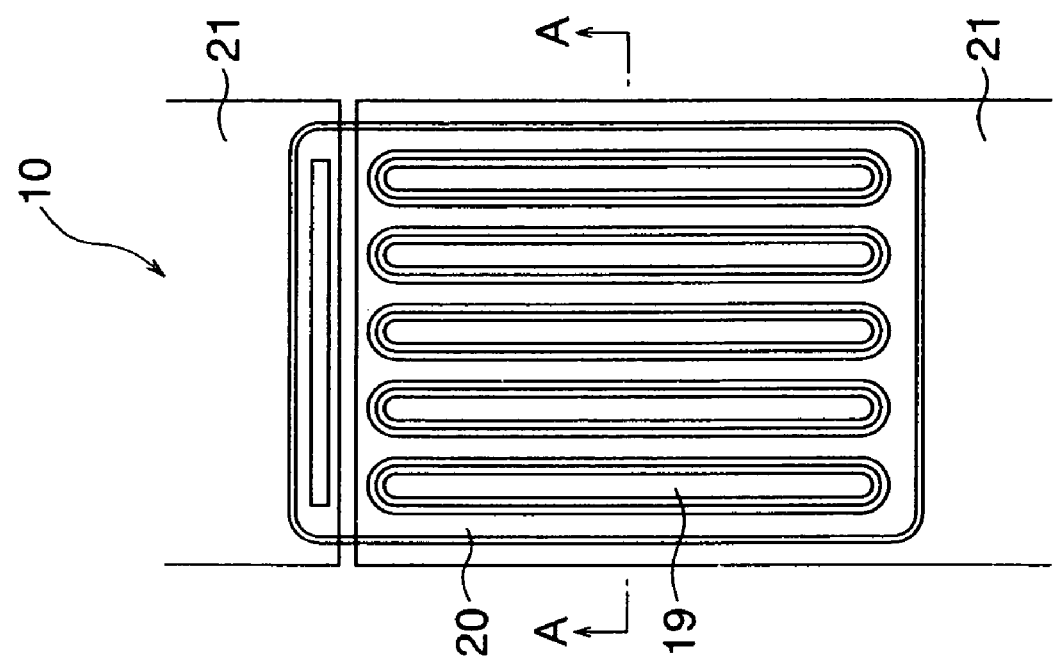

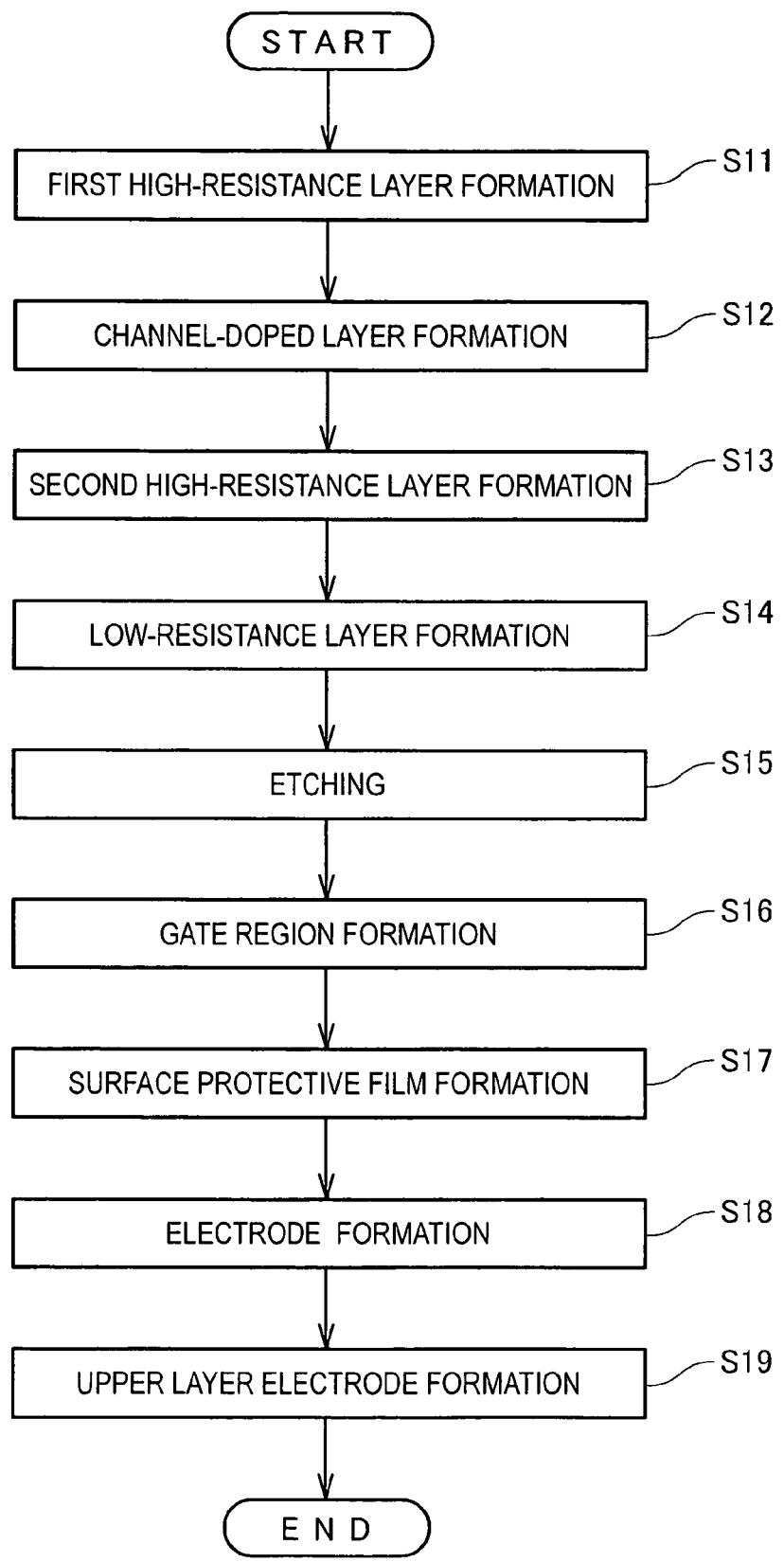

METHOD FOR MANUFACTURING JUNCTION SEMICONDUCTOR DEVICE

FIELD OF THE INVENTION

The present invention relates to a method for manufacturing a junction semiconductor device, and more specifically relates to a method for manufacturing a static induction transistor and other junction semiconductor devices.

BACKGROUND OF THE INVENTION

Semiconductor silicon carbide (SiC) has considerable bandgap energy in comparison with silicon that is widely used in devices, and is suitable for high voltage, high power, and high temperature operation. There are high expectations for its application to power devices and other components. The structure of SiC power devices, for which research and development are being actively carried out, can mainly be divided into two classes: MOS devices and junction devices. The present invention relates to a performance improvement in static induction transistors (SIT), junction field effect transistors (JFET), and other junction transistors.

Following are reported examples of SITs and JFETs in which SiC has been used.

Examples of a typical SIT have been disclosed in 600 V 5A 4H-SiC SIT with Low RonS of 13 m $\Omega$ cm$^2$ (Takashi Shinohe, and others, Proceedings of the Symposium on Static Induction Devices, Vol. 17, pp. 41-45) and 2002 *Report on the Results of Research Sponsored by New Energy and Industrial Technology Development Organization, Development of Ultra Low Loss Power Devices Technology, and Device Design Technology* (Research and Development Association for Future Electron Devices). FIG. 8 shows a cross-sectional schematic diagram of the SIT disclosed in 600 V5A 4H-SiC SIT with Low RonS of 13 $m \Omega cm^2$ by Takashi Shinohe, and others (Proceedings of the Symposium on Static Induction Devices, Vol. 17, pp. 41-45). The SIT 100 has a drain region 101 (an n-type low-resistance layer), a drift region 102 (an n-type high-resistance layer), source regions 103 of an n-type low-resistance region, gate regions 104 of a p-type low-resistance region formed so as to surround the source regions, a drain electrode 105, source electrodes 106, and gate electrodes 107. Channel regions 108 are formed between the gate regions 104. The SIT 100 does not have a channel-doped layer inside the drift region 102, but has a static induction transistor that exhibits a normally-on characteristic, which is in a conducting state when voltage is not applied to the gate electrodes 107. With this static induction transistor, high energy (MeV) ions are implanted when the gate region 104 is fabricated.

An example of a JFET is disclosed in 6A, 1 kV 4H-SiC *Normally-off Trenched-and-Implanted Vertical JFETs* (J. H. Zhao, et al., Materials Science Forum Vols. 457-460 (2004), pp. 1213-1216). FIG. 9 shows a cross-sectional structural diagram of a JFET disclosed in the preceding reference. The JFET 110 has a drain region 111 (an n-type low-resistance layer), a drift region 112 (an n-type high-resistance layer), source regions 113 of an n-type low-resistance layer, a p-type low-resistance region, p-type low-resistance gate regions 114, passivation films 115, a drain electrode 116, source electrodes 117, gate electrodes 118, trench portions 119, and a source metal layer 120. The width d of the source of the JFET is very narrow in a range of 1.45 µm to 1.95 µm. The depth D of the channel region is considerable at 2.1 µm. Additionally, with this JFET, in order to set the normally-off characteristic (non-conductive state) when voltage is not applied to the gate electrode 118, the width of the source must be made less than 1.95 µm, and such a width is very difficult to produce. In order to reduce the resistance of the gate region 114, a material with a high concentration of impurities is selected. Also, with this JFET, the gate region 114 is formed by several cycles of ion implantation in the bottom and side surfaces that have been deeply trench etched to 2 µm or greater.

FIGS. 10A, 10B, and 10C are diagrams that describe the operation of a static induction transistor (SIT), which is a typical junction transistor. In FIGS. 10A, 10B, and 10C, reference numeral 200 is a drain electrode, 201 is a drain region, 202 is a drift region, 203 is a source region, 204 is a gate region, 205 is a source electrode, 206 is a gate electrode, and 207 is a channel-doped layer. In this junction transistor, a voltage is applied to the drain electrode 200 and the source electrode 205 disposed on both surfaces of the substrate, and the main electric current that flows between the source and drain is controlled by signals applied to the gate electrode 206 that is disposed so as to surround the source region 203. Shown in this static induction transistor is an example of a normally-off type in which a channel-doped layer 207 is disposed so as to be connected to the gate region 204 in a high-resistance layer.

in this SIT, main electric current does not flow in a state in which an OFF signal is applied to the gate electrode 206. In a normally-off SIT, the OFF state is maintained by applying 0 V or negative voltage to the gate electrode 206. In the OFF state, a depletion region dr expands inside the drift region 202, and since the electric potential of the channel-doped layer is high, electrons (arrow e) can no longer travel from the source region 203 through the drift region 202, as shown in FIG. 10A. FIG. 10B shows the state in which a higher voltage than the voltage in the OFF state is applied to the gate electrode 206. When a voltage that is higher than the voltage in the OFF state is applied as the gate voltage, the depletion region dr is reduced, the electric potential of the channel-doped layer decreases, and the transistor is set in the ON state, and electron current (arrow e) flows from the source electrode 205 to the drain electrode 200. When a positive voltage is applied to the gate electrode 206, a pn junction formed between the gate and the source takes on a forward bias, and positive holes are injected (arrow h) from the gate region 204 to the drift region 202, as shown in FIG. 10C. Electrons are injected from the source region 203 due to the positive hole injection, and the electrical conductivity of the drift region increases so that the positive electric charge created by the injection of positive holes in the n-type drift region is neutralized. The ON resistance is thereby further reduced.

Thus, it is effective to apply the positive voltage to the gate electrode and increase the electrons injected from the source region into the drift region in order to obtain a lower ON voltage (resistance). In this case, the pn junction formed between the gate and source is given a forward bias, and the positive-hole electric current flows from the gate electrode to the source electrode. In order to operate the SIT at high efficiency, the device is preferably controlled with less gate electric current and with more drain electric current. For this reason, the electric current amplification factor (=drain electric current/gate electric current) is an important parameter.

Considered next is the effect of the recombination states brought about by damage that occurs due to high energy ion implantation. Since the diffusion coefficient of impurities in SiC is low, thermal diffusion that is commonly used in the case of silicon cannot be used when a selectively deep electroconductive region is formed in the SiC, and high energy (MeV) ion implantation is generally used. The gate region of a vertical junction transistor is also generally formed by high energy ion implantation. Crystal defects that cannot be restored by a following activation heat treatment remain in the ion implantation layer formed in this fashion and in the surrounding area. These crystal defects form the recombination states of electrons and positive holes. For this reason, when a forward bias is applied to the gate electrode 206 to cause an SIT such as that shown in FIG. 10C to operate, the positive holes (arrow h2) injected from the gate region 204 and electrons (arrow e2) injected from the source region 203 recombine via the recombination states (indicated by the symbol "x" in the drawing) that are present in the vicinity of the gate region 204, and the electric current amplification factor is reduced.

Described next is the normally-off characteristic. When some abnormality occurs-and the control signal to the gate electrode is cut off in a power device, the device is preferably set in an OFF state. For this reason, it is an important condition that power devices have a normally-off characteristic. In order for the structure of FIG. 8 described above to have a normally-off characteristic, the distance between adjacent gates and the width of the source must be made very narrow. FIGS. 11A and 11B are diagrams showing a comparison of a conventional device with narrow source and a device with a wide source. FIG. 11A shows the case in which the source is narrow and FIG. 11B shows the case in which the source is wide. Reference numeral 200 is a drain electrode, 201 is a drain region, 202 is a drift region, 203 is a source region, 204 is a gate region, 205 is a source electrode, and 206 is a gate electrode.

When the source is made narrow and the distance between the gates is reduced as in the device shown in FIG. 11A, manufacturing becomes difficult; the effective region (shown by the reference symbol ER in the diagram) of the entire device surface area is reduced, as shown in the diagram; and the ON voltage (resistance) increases as a result.

In the case of the SIT shown in FIG. 8, since the gate region is formed by high energy (MeV) injection, a considerable amount of recombination occurs via the recombination states created by ion implantation when the minority carrier is injected from the gate electrode, and the characteristics do not improve in bipolar mode operation that modulates conductivity in the high-resistance layer between the drain and the source. Also, since channel doping is not adopted in the structure, it is very difficult to obtain a normally-off characteristic.

In order to obtain a normally-off characteristic in the case of the JFET shown in FIG. 9, a very small trench structure with a width of 1.5 µm and a depth of about 2 µm must be made, and a gate layer must also be provided to the side walls of the trench, resulting in difficult manufacture. Also, the percentage of the source region that occupies the device must be made smaller, which hinders improvement of the ON voltage (resistance).

There is a drawback in that when a forward bias is applied to the gate electrode to operate a conventional junction transistor, the positive holes injected from the gate region and the electrons injected from the source region recombine via the surface states created by ion implantation, and the electric current amplification factor is reduced.

In order to obtain a normally-off characteristic in a convention junction transistor, the distance between adjacent gates and the width of the source must be made very narrow. When the width of the source is narrowed and the distance between gates is reduced, there is a drawback in that manufacturing becomes difficult, the effective region of the entire device surface area is reduced, and the ON voltage (resistance) increases as a result.

There is therefore a need to establish a method for manufacturing a junction semiconductor device whose structure makes it possible to establish simple steps for manufacturing a high-performance junction device having a normally-off characteristic that is required in the motor control of automobiles and other applications.

SUMMARY OF THE INVENTION

According to an aspect of the present invention, there is provided a method for manufacturing a junction semiconductor device, which comprises: forming a first high-resistance layer on one surface of a semiconductor substrate of a first conductive type; forming a channel-doped layer on the first high-resistance layer; forming a second high-resistance layer on the channel-doped layer; forming a low-resistance layer of a first conductive type that acts as a source region on the second high-resistance layer; performing partial etching to a midway depth of the second high-resistance layer and the low-resistance layer; forming a gate region below the etched portion, forming a protective film on the surface of the region between the gate region and the source region; joining a source electrode on the low-resistance layer, a gate electrode on the gate region, and a drain electrode on the other surface of the semiconductor substrate; and forming an upper layer electrode above the source electrode and the gate electrode.

In accordance with the present invention, a gate region is formed using relatively low energy ion implantation in a surface that has been etched in advance to a height between the upper surface of the channel-doped layer and the lower surface of the source layer, in contrast to the conventional method for manufacturing a junction transistor. It is thereby possible to reduce the recombination states caused by crystal defects that are produced during ion implantation and cannot be restored even by using a subsequent activation heat treatment. In a junction transistor in which the manufacturing method of the present invention is used, recombination of the minority carrier injected from the gate region and the majority carrier injected from the source region is inhibited, the electric current amplification factor can be improved, and the ON voltage (resistance) can be reduced.

Preferably, the step for forming the gate region is carried out using the ion implantation method.

In a preferred form, the implantation energy in the ion implantation method is several tens of kiloelectronvolts or greater and 1 MeV or less.

Preferably, the semiconductor crystal used in the junction semiconductor device is silicon carbide.

BRIEF DESCRIPTION OF THE DRAWINGS

A preferred embodiment of the present invention will be described in detail below, by way of example only, with reference to the accompanying drawings, in which:

FIG. 2 is a top plan view of the junction semiconductor device;

FIG. 5 is a flowchart showing the steps for manufacturing a static induction transistor by the method for manufacturing a junction semiconductor device according to the embodiment of the present invention;

DETAILED DESCRIPTION OF THE PREFERRED EMBODIMENT

Figure 1:
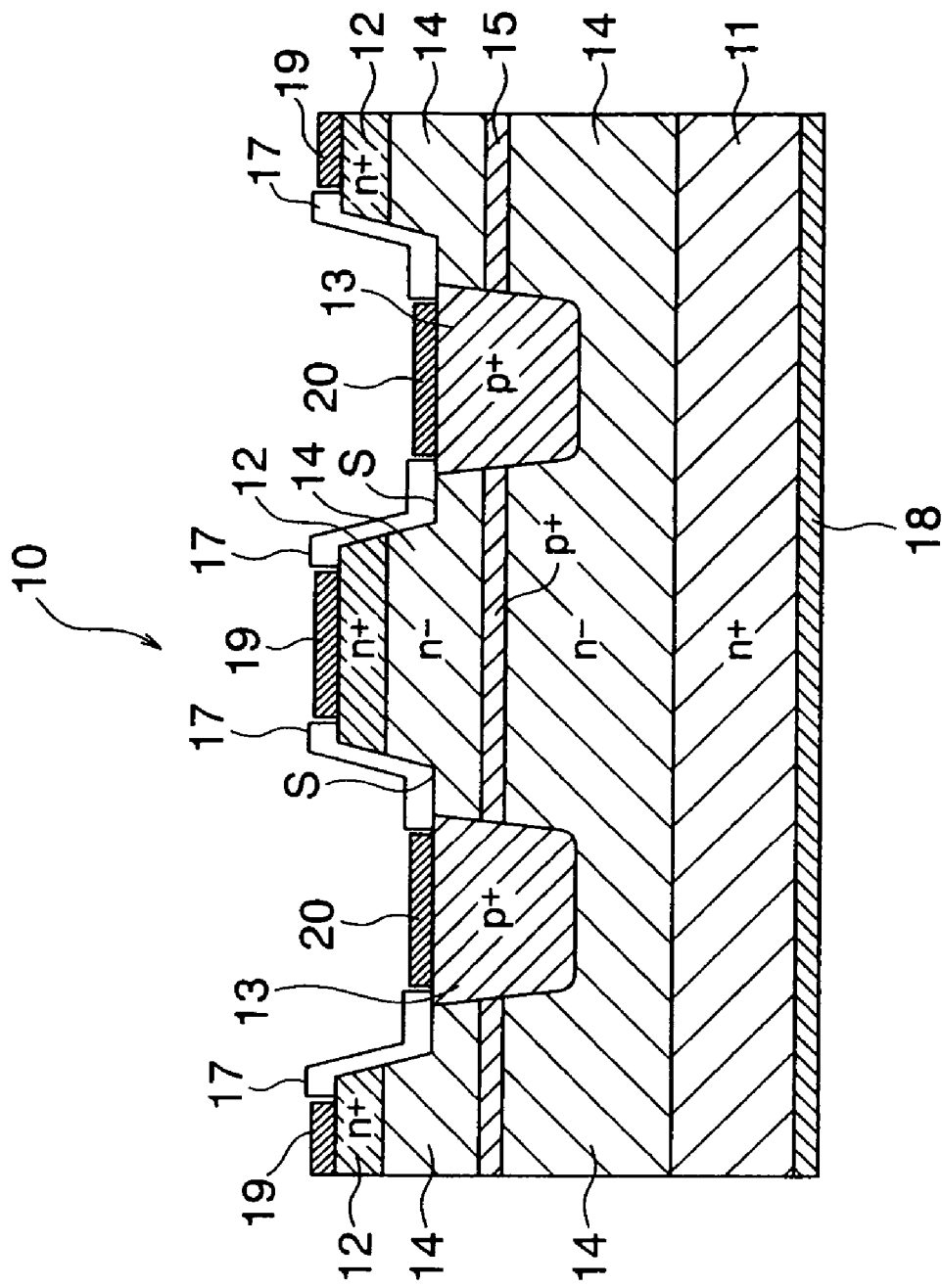
FIG. 1 is a partial cross-sectional view of a junction semiconductor device (static induction transistor (SIT) as an example) according to an embodiment of the present invention.

FIG. 1 is a structural cross-sectional diagram of a portion of the junction semiconductor device (static induction transistor (SIT) as an example) of the embodiments of the present invention, and FIG. 2 is a top view of the same. FIG. 2 shows an example of a static induction transistor having five source electrodes, and FIG. 1 shows an enlarged view of the structure of a single source electrode along the cross section A-A in FIG. 2. Disposed in a static induction transistor 10 are a drain area 11 composed of an n-type (first conductive type) low-resistance layer ($n^+$ layer) formed on one surface of a silicon carbide (SiC) crystal, a source region 12 composed of an n-type low-resistance layer ($n^+$ layer) formed on the other surface of the SiC crystal, a p-type (second conductive type) gate region 13 formed around the periphery of the source region 12, an n-type high-resistance layer ($n^-$ layer) 14 disposed between the source region 12 and the drain region 11, and a p-type channel-doped layer 15 disposed so as to be connected to the gate region 13 inside the n-type high-resistance layer 14. In the static induction transistor 10, a surface protective film 17 is furthermore disposed on the surface of the SiC crystal between the gate region 13 and source region 12. A drain electrode 18 that is joined to the drain region 11, a source electrode 19 that is joined to the source region 12, and a gate electrode 20 that is joined to the gate region 13 are also provided in the static induction transistor 10. FIG. 2 shows an upper layer electrode 21 disposed in the upper portion of the source electrode 19 and gate electrode 20.

Figure 3A:
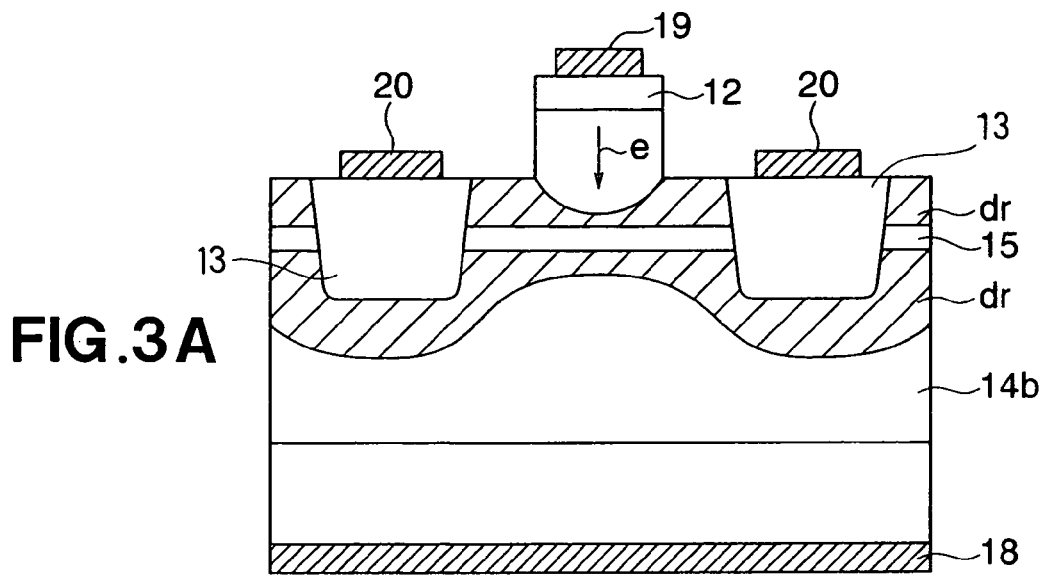
FIGS. 3A to 3C are schematic views illustrating an operation of the junction semiconductor device, FIG. 3A showing a state in which voltage equal to or less than the pinch-off voltage is applied to the gate electrode, FIG. 3B showing a state in which voltage equal to or greater than the pinch-off voltage is applied to the gate electrode, and FIG. 3C showing a state in which even higher voltage is applied to the gate electrode.
Figure 3B:
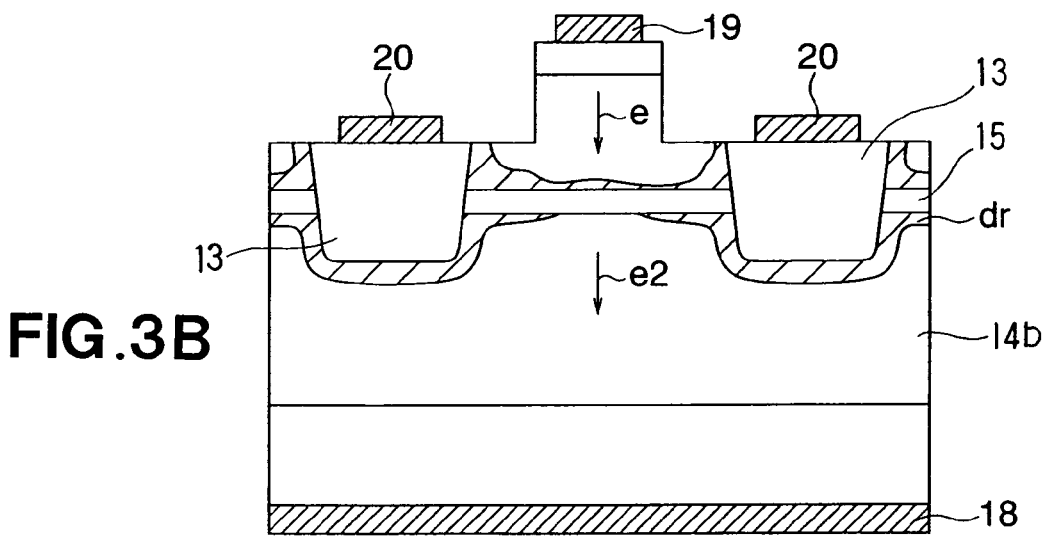
Figure 3C:
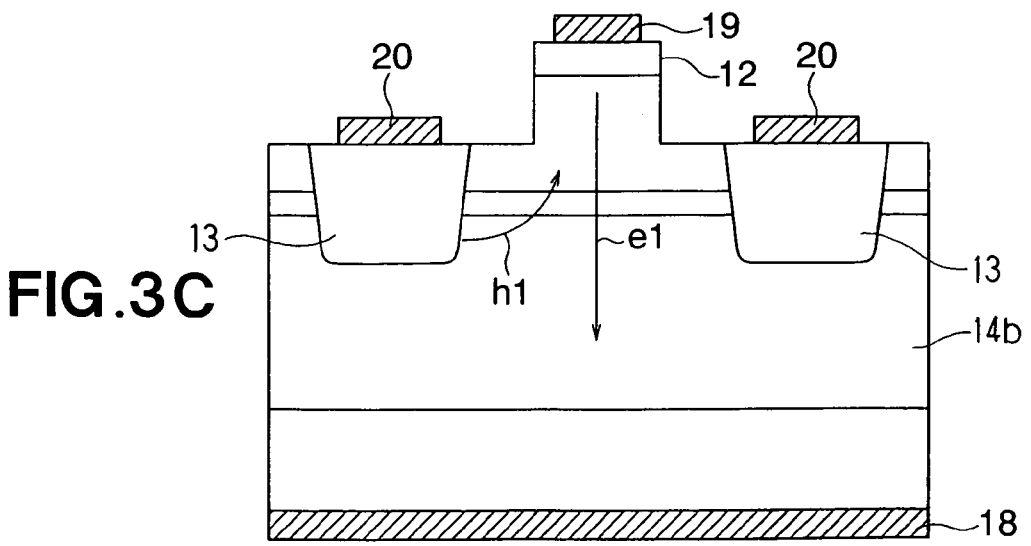

FIGS. 3A, 3B, and 3C are diagrams showing the operation of the static induction transistor of the present embodiment. FIG. 3A shows the state in which a drain voltage VD is applied between the source electrode 19 and drain electrode 18, and a voltage that is equal to or less than the pinch-off voltage is applied to the gate electrode 20 in the static induction transistor 10. In this case, the depletion region dr inside the drift region 14b expands, and since the electric potential of the channel-doped layer 15 is high, the electrons (arrow e) from the source region 12 are obstructed by the barrier of the depletion region dr and the channel-doped layer 15, and do not flow through the drift region 14b. Conversely, when a voltage that is equal to or greater than the pinch-off voltage is applied to the gate electrode 20, as shown in FIG. 3B, the depletion region dr narrows, the electric potential of the channel-doped layer 15 is reduced, and electrons (arrow e2) flow between the source electrode 19 and drain electrode 18, resulting in the flow of electric current. When voltage is further applied to the gate electrode 20 as shown in FIG. 3C, positive holes are injected (arrow h1) from the gate region 13 into the drift region 14b. Electrons (arrow e1) are thereby injected from the source region 12 so as to satisfy the electric charge neutralization condition, and the high-resistance layer is conductively modulated. The ON resistance is also thereby reduced.

Figure 10A:
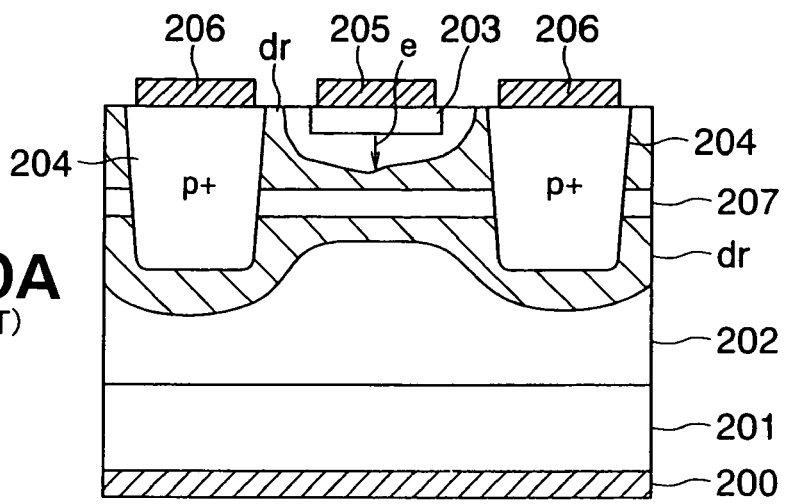
FIGS. 10A to 10C are schematic view showing an operation of a typical conventional junction transistor.
Figure 10B:
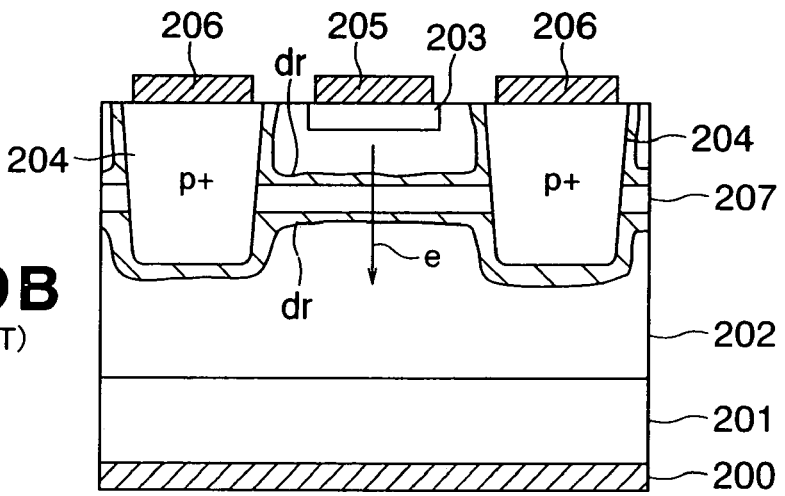
Figure 10C:
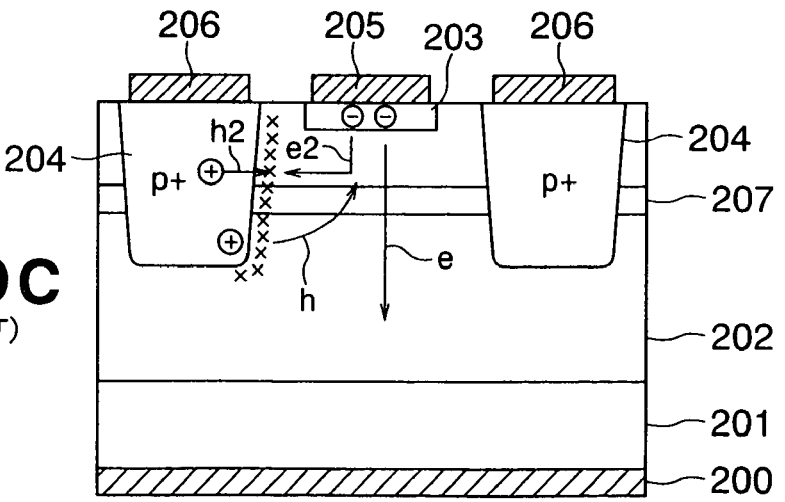
Figure 11A:
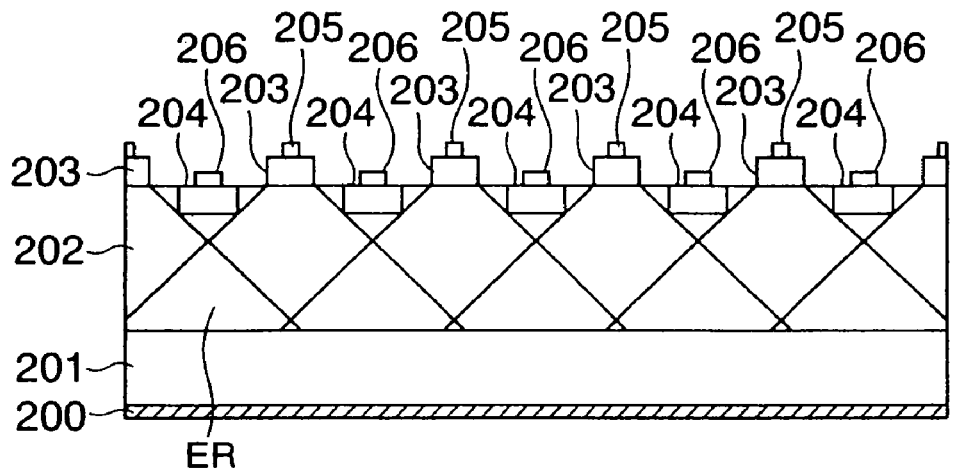
FIGS. 11A and 11B are schematic view showing a comparison of a device having a narrow source and a device having a wide source.
Figure 11B:
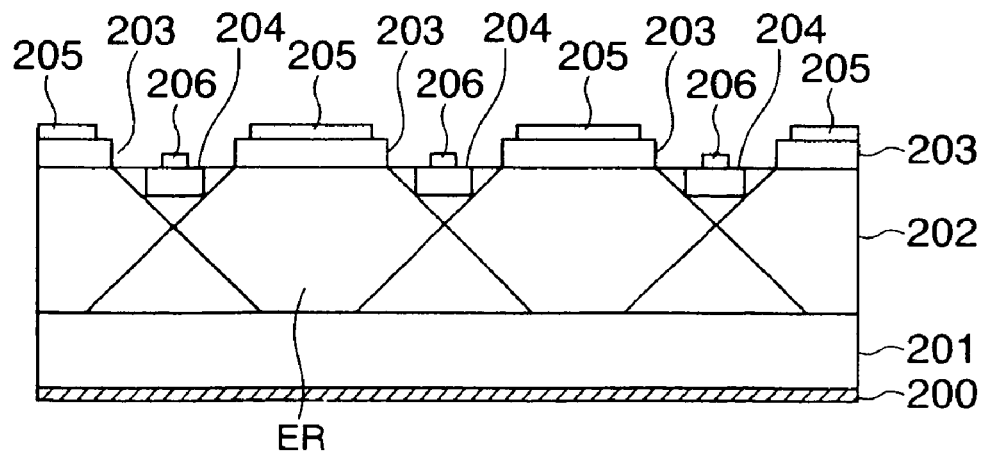

In the structure fabricated by the conventional manufacturing method shown in FIGS. 10A, 10B, and 10C, applying a voltage causes electrons from the source region and positive holes from the gate region to recombine, and the electrons that arrive from the source region to the drain electrode are reduced. It is for this reason that the electric current amplification factor is reduced. However, in accordance with the manufacturing method of the present invention described below, the portion in which the gate region is to be formed is etched in advance to a depth that is between the lower surface of the source region and the upper surface of the channel-doped layer, and a gate region is thereafter formed by relatively low energy ion implantation. By using this process, the crystal defects that occur during ion implantation and cannot be restored even by a subsequent thermal treatment can be reduced and the electric current amplification factor of the device can be improved. Also, in the present invention, the distance between adjacent gates and the source width can be increased while maintaining the normally-off characteristic by providing a channel-doped layer. For this reason, manufacture can be made simple, the effective region of the entire surface area of the device can be expanded, and, as a result, the ON voltage (resistance) can be successfully inhibited.

Next, the structure of a junction semiconductor device manufactured in accordance with the embodiments of the present invention (using a static induction transistor (SIT) as an example) is described with reference to FIG. 1. FIG. 1 shows an SIT that is designed with a blocking voltage of 600 V as an embodiment. A low-resistance n-type 4H-SiC substrate that is offset by 8° from the (0001) plane is used as the substrate, and in the present SIT, this substrate acts as the drain area 11. The n-type high-resistance layer 14 on the substrate is a layer for blocking high voltage between the source and the drain, and in the present embodiment, the thickness is set to 10 μm and the impurity concentration is set to $1 \times 10^{16}$ $cm^{-3}$ so that voltage that is 600 V or higher is blocked. The p-type channel-doped layer on the high-resistance layer is designed with a thickness and impurity concentration that do not allow the transistor to become switched on even when the voltage $V_{GS}$ between the gate and source is 0 V when a high voltage is applied between the source and drain. In the present embodiment, the thickness is set to between 0.1 μm and 0.5 μm, and the impurity concentration is set to between $2 \times 10^{17}$ and $4 \times 10^{19}$ $cm^{-3}$. Disposed on the channel-doped layer is a low-resistance n-type source region that has a thickness of 0.2 to 0.4 μm and an impurity concentration of 1 to $4\times10^{19}$ cm$^{-3}$ and is sandwiched between high-resistance layers that have a thickness of 0.2 to 0.4 μm and an impurity concentration of $1\times10^{16}$ cm$^{-3}$. A low-resistance p-type gate region that has a thickness of 2 μm and an impurity concentration of about $1\times10^{19}$ cm$^{-3}$ is disposed about the periphery of the source region. The source electrode has a long narrow insular shape, and a plurality of the source electrodes are provided in a single device, as shown in FIG. 2. A single source electrode is approximately 3 to 10 μm in width and 100 to 1,000 μm in length. The cycle of a unit device that includes the gate region and source region is about 10 to 30 μm.

FIG. 4 shows the electric current-voltage characteristics of the SIT in the embodiments of the present invention, and the characteristics of an SIT that has been fabricated without using the present invention. The characteristic values of both these configurations are summarized in the following table.

TABLE 1

| PROCESS | ELECTRIC CURRENT AMPLIFICATION FACTOR Vds = 3 V, IG = 7.9 A/cm$^2$ | ON VOLTAGE Ic = 100 A/cm$^2$ |
|---|---|---|
| CONVENTIONAL | 13 | 1.2 |
| EMBODIMENT | 44 | 0.8 |

Figure 4A:
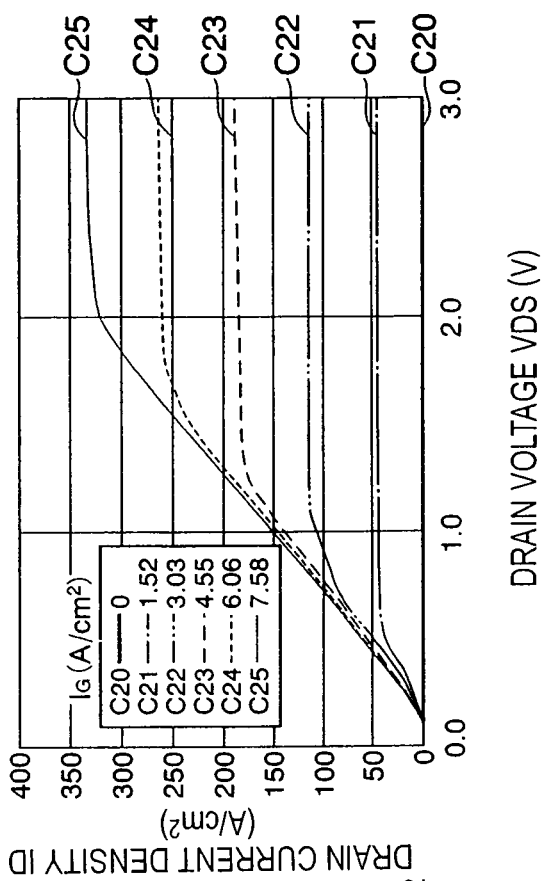
FIG. 4A is a diagram showing electric current-voltage characteristics of an SIT in the case of a conventional process.
Figure 4B:
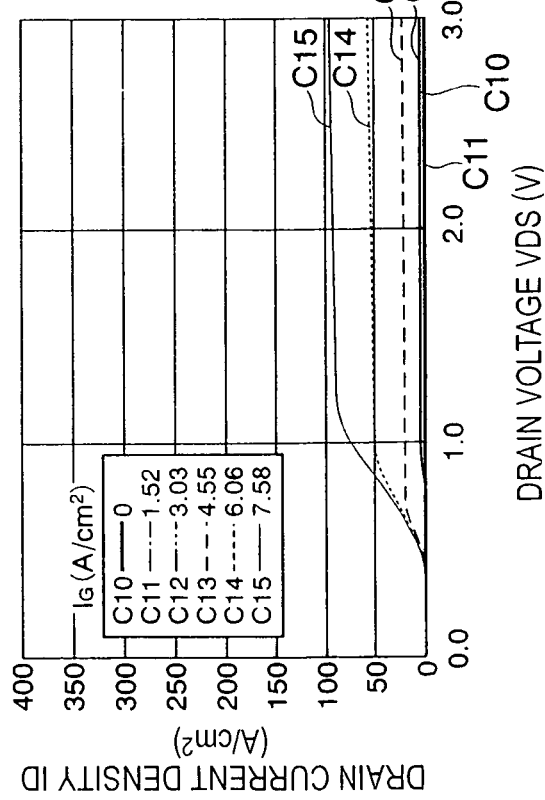
FIG. 4B is a diagram showing electric current-voltage characteristics of an SIT in the case of the process of the present invention.

With conventional techniques, a gate region is formed using high energy ion implantation of 2 MeV or higher prior to separation etching of the source region. Other than the source separation etching step, the order of ion implantation into the gate region, and the ion implantation conditions, the same manufacturing steps are used. FIG. 4A shows the electric current-voltage characteristics of an SIT that has been fabricated using a conventional manufacturing method, and FIG. 4B shows the electric current-voltage characteristics of a transistor in the present invention fabricated using the manufacturing method of the present invention. The horizontal axis shows the drain voltage, and the vertical axis shows the drain electric current density. The curves C10, C11, C12, C13, C14, and C15 are the electric current-voltage characteristics in which the gate current is 0, 1.52, 3.03, 4.55, 6.06, and 7.58 (A/cm$^2$), respectively; and the curves C20, C21, C22, C23, C24, and C25 are the electric current-voltage characteristics in which the gate current is 0, 1.52, 3.03, 4.55, 6.06, and 7.58 (A/cm$^2$), respectively. From these electric current-voltage characteristics, the electric current amplification factor and ON voltage were 13 and 1.2, respectively, as shown in TABLE 1, when a conventional manufacturing method was used. When the manufacturing method of the present invention was used, the electric current amplification factor and ON voltage were 44 and 0.8, respectively. It is apparent that the electric current amplification factor and the ON voltage are both considerably improved by using the manufacturing steps of the present invention. Also, SITs having various structures were compared, and it was confirmed that the average increase in the electric current amplification factor was about 300%.

Described next is the method for manufacturing the junction semiconductor (using SIT as an example) of the embodiments of the present invention. FIG. 5 is a flowchart showing the steps for manufacturing a static induction transistor (SIT) by the method for manufacturing a junction semiconductor device of the embodiments of the present invention. FIGS. 6A to 6D and FIGS. 7A to 7C are structural cross-sectional diagrams of each step. The method for manufacturing a junction semiconductor device includes the following steps: a step for forming a first high-resistance layer on a semiconductor substrate of a first conductive type (step S11); a step for forming a channel-doped layer on the first high-resistance layer (step S12); a step for forming a second high-resistance layer on the channel-doped layer (step S13); a step for forming a low-resistance layer of a first conductive type that acts as a source region (step S14); a step for performing partial etching to a midway depth of the second high-resistance layer and the low-resistance layer (step S15); a step for forming a gate region below the portion that was etched in the etching step (step S16); a step for forming a surface protective film (step S17); an electrode formation step for forming a source electrode, a gate electrode, and a drain electrode (step S18); and a step for forming an upper layer electrode on the source electrode and gate electrode side (step S19).

Figure 6A:
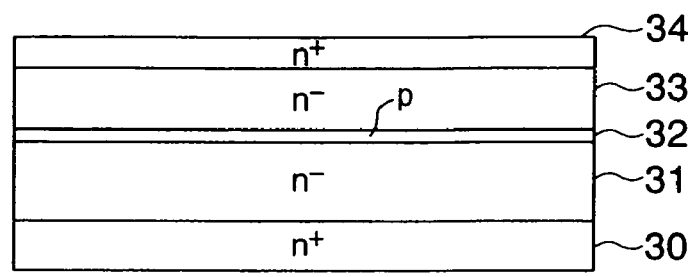
FIGS. 6A to 6D are cross-sectional views illustrating a semiconductor substrate in the steps for manufacturing a static induction transistor by the method for manufacturing a junction semiconductor device according to the embodiment of the present invention.

In the step for forming a first high-resistance layer (step S11), an SiC layer 31 doped with nitrogen as an impurity (concentration: $1\times10^{16}$ cm$^{-3}$) is grown to a thickness of 10 μm on an SiC high-density n-type substrate 30 by using epitaxial growth. Next, in the step for forming a channel-doped layer (step S12), SiC 32 is grown to a thickness of 0.1 to 0.5 μm with aluminum as an impurity (concentration: $1\times10^{17}$ to $1\times10^{19}$ cm$^{-3}$) by using epitaxial growth. In the step for forming a high-resistance layer (step S13), an SiC layer 33 doped with nitrogen as an impurity (concentration: $1\times10^{1}$ cm$^{-3}$) is thereafter epitaxially grown to a thickness of 0.2 to 0.5 μm. In the step for forming a low-resistance layer (step S14), an SiC layer 34 doped with nitrogen as an impurity (concentration: 1 to $5\times10^{19}$ cm$^{-3}$) is thereafter epitaxially grown thereon to a thickness of 0.2 to 0.4 μm (FIG. 6A). The channel-doped layer (SiC) 32 and the source layer (SiC layer) 34 can be also formed by ion implantation.

Figure 6B:
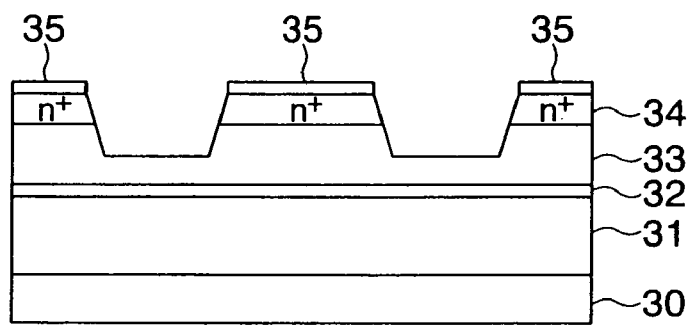

Performed next is the etching step (step S15) for separating the source regions (FIG. 6B). A resist pattern is formed in the photolithography step by using CVD silicon oxide film as the etching mask, the CVD silicon oxide film is thereafter etched using RIE or the like, and the SiC is then etched, with the CVD silicon oxide film acting as the mask 35. RIE or the like in which SF$_6$ or the like is used may be used to etch the SiC. The etching is carried out to a height that lies between the lower surface of the source layer 34 and the upper surface of the channel-doped layer 32. The etching depth in the present embodiment is about 0.3 to 0.6 μm. Since the etching depth with respect to the source width and gate width is shallow, the process can easily be carried out.

Figure 6C:
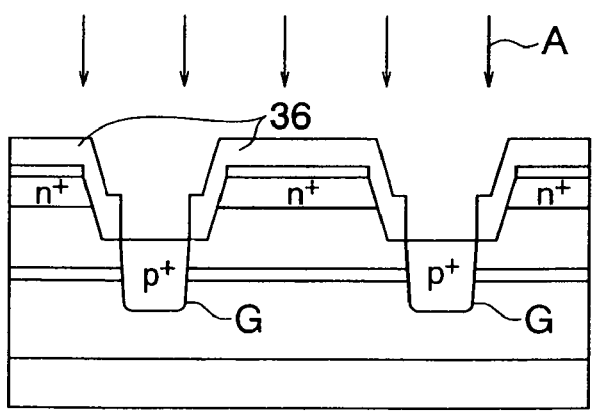

In the step for forming a gate region (step S16), a p-type gate region G is formed by selective ion implantation. In FIG. 6C, first, an ion implantation mask 36 is formed for protecting the regions in which gate regions are not formed on the surface.

A CVD (chemical vapor deposition) silicon oxide film or a metal may be used as the mask material.

In the photolithography step, a resist is applied and the ion-implantation areas of the resist are then removed. In this step, the photoresist forms a mask in which the areas for forming the gate regions are open. The mask material of the regions in which ions will be implanted is etched away by reactive ion etching (RIE) or the like to form the mask. Thus, an ion implantation mask is formed, and ion implantation is thereafter carried out in order to form gate regions (arrow A in the diagram).

Figure 6D:
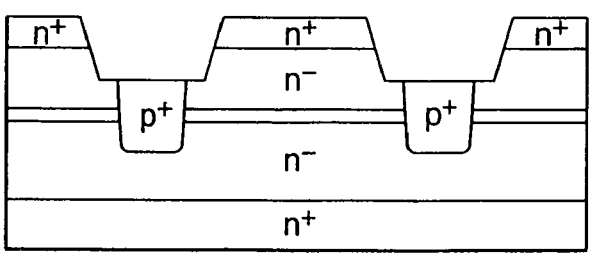

Aluminum is used as the ion type for ion implantation from the surface, for example. When the withstand voltage of the device is 600 V, about 2 μm is the distance required from the upper surface of the source region to the lower surface of the gate region, with the added effect of the withstand voltage improvement produced by the channel-doped layer. Ion implantation having a high energy of about 2 MeV is required to form a gate region having a depth of about 2 μm without performing etching to separate the gate regions. In the present embodiment, since etching is carried out to a depth of 0.3 to 0.6 μm to separate the gate regions, the ion implantation energy can be reduced to about 1 MeV. The implantation amount is designed so that the impurity concentration is about $1\times10^{18}$ to $1\times10^{19}$ cm$^{-3}$. After implantation, the ion implantation mask 36 is removed by etching (FIG. 6D).

After ion implantation, the implanted ions are electrically activated in the semiconductor, and activation heat treatment is carried out to remove the crystal defects produced by ion implantation. Heat treatment is carried out for about 10 minutes at a high temperature of about 1,700 to 1,800° C. using a high frequency heat treatment furnace, or the like. Argon is used as atmospheric gas.

Figure 7A:
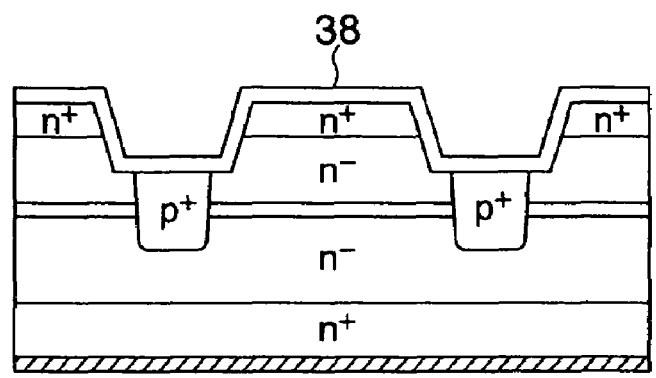
FIGS. 7A to 7C are cross-sectional views illustrating a semiconductor substrate in the steps for manufacturing a static induction transistor by the method for manufacturing a junction semiconductor device according to the embodiment of the present invention.

In the step for forming a protective layer 38 (S17), sacrificial oxidation that removes the oxide layer after thermal oxidation is first carried out to remove the surface layer formed in the ion implantation and activation heat treatment steps, as shown in FIG. 7A. The oxidation conditions include a temperature of 1,100° C. for 20 hours in dry oxygen, for example. Hydrogen fluoride can be used to remove the oxide film. Sacrificial oxidation is performed and thermal oxidation is thereafter carried out again to form an oxide film. Heat treatment (POA: Post Oxidation Annealing) is thereafter carried out to reduce the impurity level of the SiC oxide film interface. POA is carried out at a high temperature of about 800 to 1,300° C. in a hydrogen or nitrogen oxide (NO, $N_2O$) atmosphere or in an argon atmosphere. After POA, a CVD oxide film or a CVD nitride film is formed.

Figure 7B:
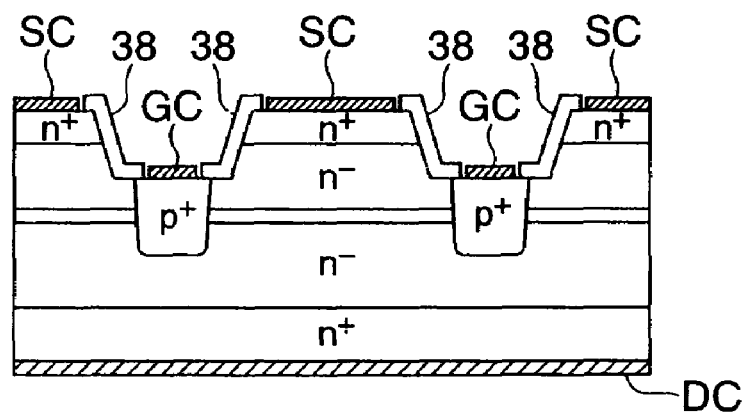

After the above process has been completed, electrodes SC, GC, and DC are formed on the source regions, gate regions, and drain regions, respectively (FIG. 7B). Nickel or titanium is used as the source and drain electrodes, and titanium, aluminum, or the like is used as the gate electrode. The electrodes are formed by vapor deposition, sputtering, or the like; and dry etching, wet etching, lift-off, or another method may be used together with the photolithography step to form a pattern. Also, after electrodes have been formed, heat treatment is carried out to reduce the contact resistance of the metal and semiconductor. The conditions are a temperature of 800 to 1,000° C. for about 10 to 30 minutes.

Figure 7C:
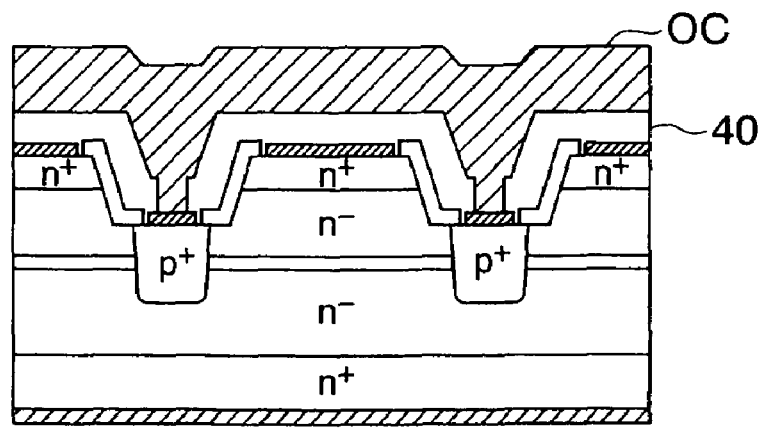
Figure 8:
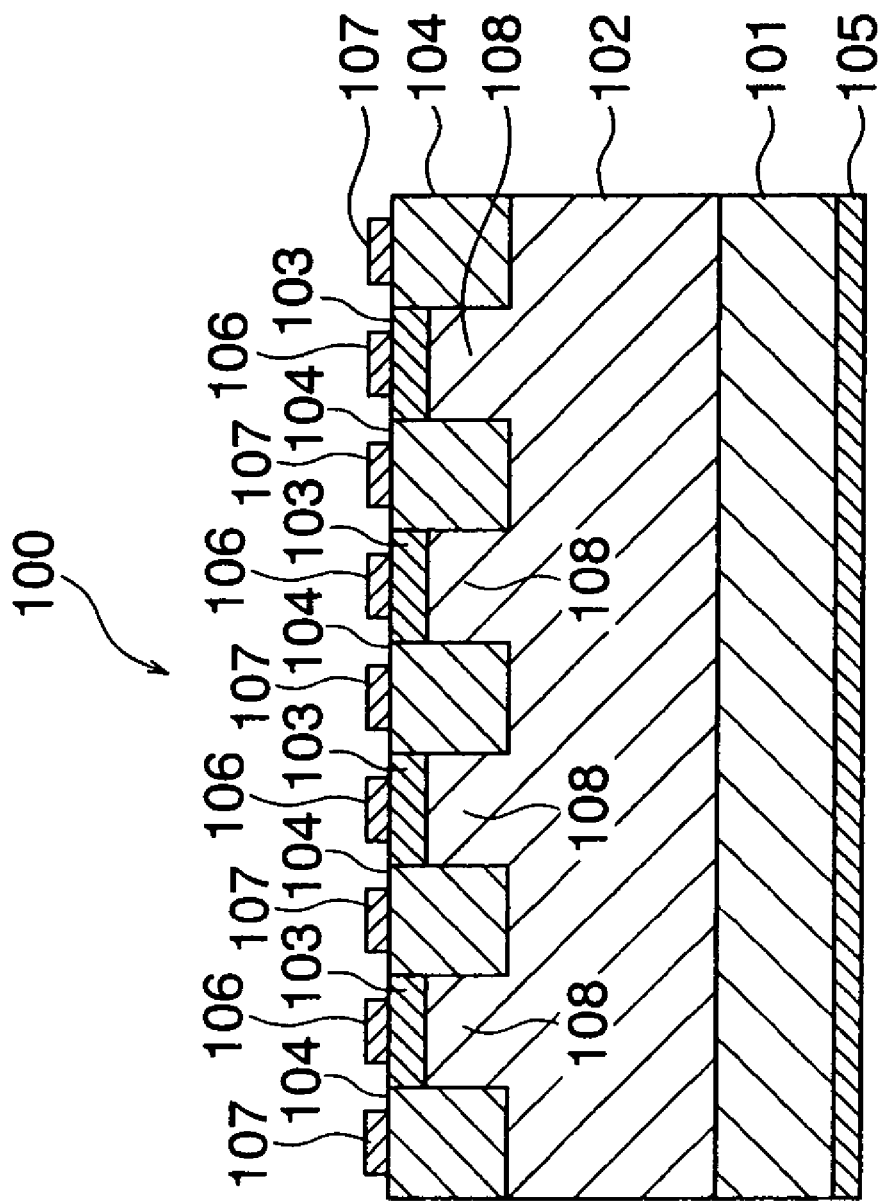
FIG. 8 is a cross-sectional view showing a conventional SIT.
Figure 9:
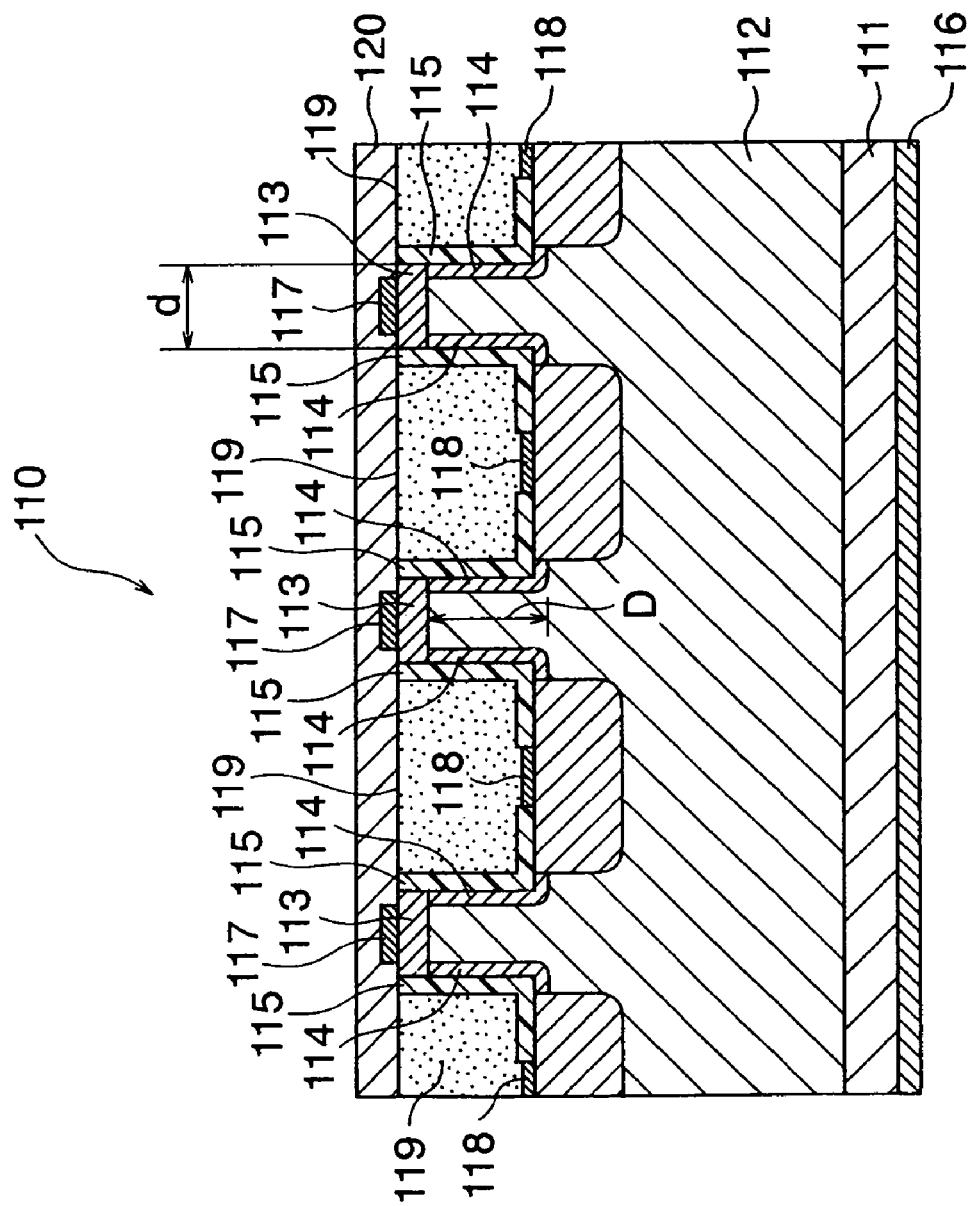
FIG. 9 is a cross-sectional view showing a conventional JFET.

Lastly, an upper layer wiring step is carried out to bring out the separated source electrodes to a single electrode (FIG. 7C). After a CVD oxide film or the like is formed as an interlayer film 40, the CVD oxide film or the like of the source electrode portion is removed by photolithography and etching to expose the source electrodes, and an upper layer electrode OC is thereafter deposited. Aluminum is used as the electrode material.

The high-performance SIT having a normally-off characteristic shown in FIGS. 1 and 2 can be fabricated in this manner. The thicknesses of the layers, the amount of ion implantation energy, and other specific numerical values shown in the embodiment are no more than examples, and the numerical values may be suitably modified within the scope of implementing the present invention.

In the present embodiment, the P and N polarities in the description of the steps may be inverted, and the opposite polarity may be used. Also, an example of SiC was described in the present embodiment, but the present invention may also be applied to other semiconductors.

The present invention can be used in a high-performance junction semiconductor device and in the manufacture of such a high-performance junction semiconductor device.

Obviously, various minor changes and modifications of the present invention are possible in the light of the above teaching. It is therefore to be understood that within the scope of the appended claims the invention may be practiced otherwise than as specifically described.

What is claimed is:

1. A method for manufacturing a junction semiconductor device, comprising:
    forming a first high-resistance layer on one surface of a semiconductor substrate of a first conductive type;
    forming a channel-doped layer on said first high-resistance layer;
    forming a second high-resistance layer on said channel-doped layer;
    forming a low-resistance layer of a first conductive type that acts as a source region directly on an upper surface of said second high-resistance layer;
    performing etching through said low-resistance layer and partial etching through said second high-resistance layer until a midway depth thereof so that a partially etched-out portion of the second high-resistenace layer has a bottom lying between a lower surface of the source region and an upper surface of the channel-doped layer;
    forming a gate region below the partially etched-out portion of the second high-resistance layer;
    forming a protective film on a surface of a region between said gate region and said source region;
    joining a source electrode on said low-resistance layer; a gate electrode on said gate region, and a drain electrode on the other surface of said semiconductor substrate; and
    forming an upper layer electrode above the source electrode and the gate electrode,
    wherein the step of forming the protective film includes forming the protective film along a bottom of the recessed-shaped etched portion, on which the gate electrode is subsequently disposed.

2. The method for manufacturing a junction semiconductor device according to claim 1, wherein the step for forming said gate region is carried out using the ion implantation method.

3. The method for manufacturing a junction semiconductor device according to claim 2, wherein the implantation energy in said ion implantation method is several tens of kiloelectronvolts or greater and 1 MeV or less.

4. The method for manufacturing a junction semiconductor device according to claim 1, wherein the semiconductor crystal that is used in said junction semiconductor device is silicon carbide.

5. The method for manufacturing a junction semiconductor device according to claim 1, wherein the step of forming the low-resistance layer that acts as the source region includes forming the low-resistance layer on an entire upper surface of said second high-resistance layer.

6. The method for manufacturing a junction semiconductor device according to claim 1, wherein the step of joining the source electrode on said low-resistance layer, and joining the gate electrode on said gate region is performed after performing the step forming the protective film.

7. The method for manufacturing a junction semiconductor device according to claim 1, wherein the gate electrode is disposed entirely within the recess-shaped etched portion of the second high-resistance layer.

8. The method for manufacturing a junction semiconductor device according to claim 1, prior to the step of forming the upper layer electrode, the method further comprising the steps of:
    forming an oxide film as an interlayer film above the source electrode and the gate electrode, and
    etching away the interlayer film to expose at least one of the source electrode and the gate electrode.

9. A method for manufacturing a junction semiconductor device, comprising:
- forming a first high-resistance layer on one surface of a semiconductor substrate of a first conductive type;
- forming a channel-doped layer on said first high-resistance layer;
- forming a second high-resistance layer on said channel-doped layer;
- forming a low-resistance layer of a first conductive type that acts as a source region directly on an upper surface of said second high-resistance layer;
- performing etching through said low-resistance layer and partial etching through said second high-resistance layer until a midway depth thereof so that a partially etched-out portion of the second high-resistance layer has a bottom lying between a lower surface of the source region and an upper surface of the channel-doped layer;
- forming a gate region below the partially etched-out portion of the second high-resistance layer;
- forming a protective film on a surface of a region between said gate region and said source region;
- joining a source electrode on said low-resistance layer; a gate electrode on said gate region, and a drain electrode on the other surface of said semiconductor substrate; and
- forming an upper layer electrode above the source electrode and the gate electrode,
- wherein the gate electrode is disposed entirely on a bottom of the etched-out portion of the second high-resistance layer such that an upper surface of the gate electrode does not extend above an upper surface of the second high-resistance layer.

10. The method for manufacturing a junction semiconductor device according to claim 9, wherein the step for forming said gate region is carried out using an ion implantation method.

11. The method for manufacturing a junction semiconductor device according to claim 10, wherein an implantation energy in said ion implantation method is several tens of kiloelectronvolts or greater and 1 MeV or less.

12. The method for manufacturing a junction semiconductor device according to claim 9, wherein a semiconductor crystal that is used in said junction semiconductor device is silicon carbide.

13. The method for manufacturing a junction semiconductor device according to claim 9, wherein the step of forming the low-resistance layer that acts as the source region includes forming the low-resistance layer on an entire upper surface of said second high-resistance layer.

14. The method for manufacturing a junction semiconductor device according to claim 9, wherein the step of joining the source electrode on said low-resistance layer, and joining the gate electrode on said gate region is performed after performing the step forming the protective film.

15. The method for manufacturing a junction semiconductor device according to claim 9, prior to the step of forming the upper layer electrode, the method further comprising the steps of:
- forming an oxide film as an interlayer film above the source electrode and the gate electrode, and
- etching away the interlayer film to expose at least one of the source electrode and the gate electrode.

16. The method for manufacturing a junction semiconductor device according to claim 1, wherein the source region has a width, the partially etched-out portion has an etching depth, and the ratio of the etching depth of the partially etched-out portion to the width of the source region is 0.03 to 0.02.

17. The method for manufacturing a junction semiconductor device according to claim 16, wherein the width of the source region is 3 to 10 μm, and the etching depth of the partially etched-out portion is 0.3 to 0.6 μm.

18. The method for manufacturing a junction semiconductor device according to claim 16, wherein the cycle of a unit device that includes the source region and the gate region is 10 to 30 μm.

19. The method for manufacturing a junction semiconductor device according to claim 9, wherein the source region has a width, the partially etched-out portion has an etching depth, and the ratio of the etching depth of the partially etched-out portion to the width of the source region is 0.03 to 0.02.

20. The method for manufacturing a junction semiconductor device according to claim 19, wherein the width of the source region is 3 to 10 μm, and the etching depth of the partially etched-out portion is 0.3 to 0.6 μm.

21. The method for manufacturing a junction semiconductor device according to claim 19, wherein the cycle of a unit device that includes the source region and the gate region is 10 to 30 μm.

* * * * *